United States Patent [19]
Fluegal

[11] 3,885,220
[45] May 20, 1975

[54] BUFFERED MULTIPLEXER WITH DIFFERENTIAL AMPLIFIER

[75] Inventor: Dale A. Fluegal, Bartlesville, Okla.

[73] Assignee: Phillips Petroleum Company, Bartlesville, Okla.

[22] Filed: Dec. 4, 1973

[21] Appl. No.: 421,508

[52] U.S. Cl. ................ 330/30 R; 307/243; 328/104; 328/154; 330/51; 330/124 R
[51] Int. Cl. .......................... H03f 3/68; H03k 17/00
[58] Field of Search ............ 307/241, 243; 328/152, 328/154, 104; 330/30 R, 51, 124 R

[56] References Cited

UNITED STATES PATENTS

| | | | |
|---|---|---|---|
| 2,556,693 | 6/1951 | Houghton | 328/152 |
| 3,230,397 | 1/1966 | Linder | 330/30 R |
| 3,387,224 | 6/1968 | Fleischer et al. | 328/152 |
| 3,453,554 | 7/1969 | Shoemaker | 330/30 R |
| 3,539,928 | 11/1970 | Gardner et al. | 328/104 |
| 3,550,016 | 12/1970 | Gugliotti | 307/243 |
| 3,621,288 | 11/1971 | Brown | 307/243 |
| 3,755,750 | 8/1973 | Herberling | 307/229 |

*Primary Examiner*—Stanley D. Miller, Jr.

[57] ABSTRACT

A multiplexer is disclosed which comprises a common output circuit having first and second buffer amplifiers and a differential amplifier connected to the outputs of the first and second buffer amplifiers. A plurality of input circuits are provided to receive individual signals. Each input circuit includes third and fourth buffered amplifiers which are connected to respective input terminals. The outputs of the third and fourth buffer amplifiers are connected selectively by switching means to the respective inputs of the first and second buffer amplifiers of the common output circuit.

5 Claims, 2 Drawing Figures

BUFFERED MULTIPLEXER WITH DIFFERENTIAL AMPLIFIER

Various types of analysis and control systems have been developed in recent years which employ digital computers to make calculations. The computers are supplied with data from a number of sources. In a typical process control system, the data sources include measurements of process variables such as temperature, flow rates and analyses of process streams. These measurements are usually made by analog devices. Therefore, a number of analog signals are established which must be transmitted in sequence to suitable analog-to-digital converters before being introduced into the computer. In order to accomplish this selected transmission, multiplexers are employed with switching means to pass a plurality of signals sequentially to a common receiver.

In accordance with this invention, an improved buffered multiplexer is provided which is particularly adapted to transmit analog signals having amplitude in the general range of 1 to 10 volts. The multiplexer of this invention includes a common output circuit having first and second buffer amplifiers which receive first and second signals selectively from a plurality of input circuits. The outputs of the first and second amplifiers are preferably transmitted through a differential amplifier to provide an adjustable balanced circuit. A plurality of input circuits are provided to receive the respective signals. Each input circuit comprises third and fourth buffered amplifiers which receive respective input signals. The outputs of the third and fourth amplifiers are connected selectively by switching means to the respective inputs of the first and second amplifiers of the common output circuit. Low pass filter means are employed to advantage in the inputs of both circuits to reduce 60 cycle and higher frequency noise signals.

Figure 1:
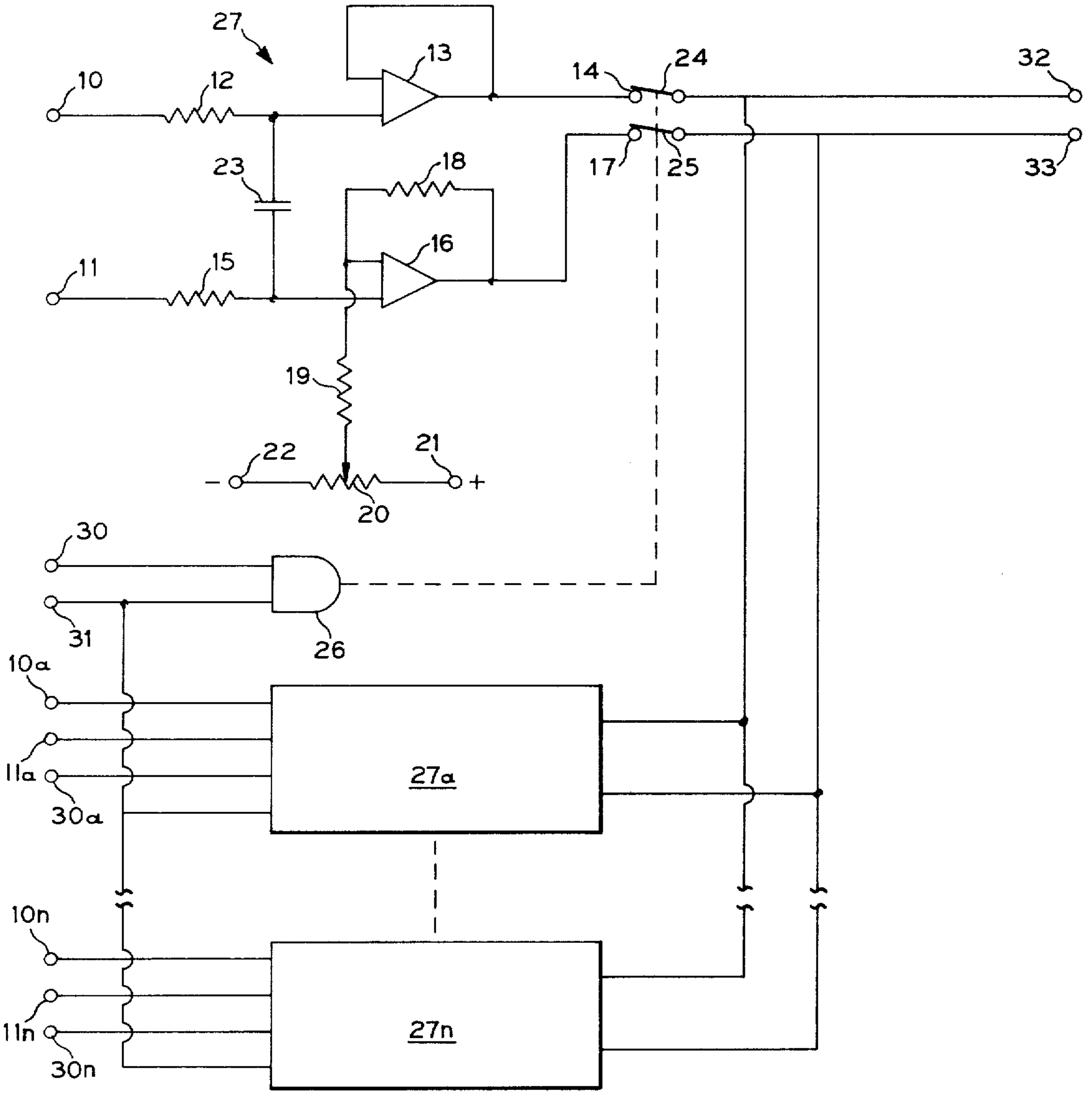
FIG. 1 illustrates a plurality of input circuits of the multiplexer.

Referring now to the drawing in detail and to FIG. 1 in particular, there is shown an input circuit having first and second input terminals 10 and 11 which receive an analog signal to be transmitted. Terminal 10 is connected by a resistor 12 to the first input of an amplifier 13 which is a unity gain follower. The output of amplifier 13 is connected to a terminal 14 and to the second input of the amplifier. Terminal 11 is connected by a resistor 15 to the first input terminal of a second amplifier 16. The output of amplifier 16 is connected to a terminal 17. A feedback resistor 18 is connected between the output of amplifier 16 and the second input terminal. A resistor 19 is connected between this second input terminal and the contactor of a potentiometer 20. The end terminals of potentiometer 20 are connected to respective positive and negative potential terminals 21 and 22. A filter capacitor 23 is connected between the first input terminals of amplifiers 13 and 16.

Terminals 14 and 17 are adapted to be engaged by respective switches 24 and 25. Switches 24 and 25 are actuated by an AND circuit 26 which is connected to input terminals 30 and 31. Switches 24 and 25 are connected to respective terminals 32 and 33.

As previously mentioned, amplifier 13 operates as a unity gain follower. The gain of amplifier 16 is controlled by the relative values of resistors 18 and 19, which can be of the order of 100 ohms and 560,000 ohms, respectively. Potentiometer 20 permits the zero point of the circuit to be adjusted to compensate for any unbalance of the two amplifiers. Resistors 12 and 15 can have values of the order of 100,000 ohms each, and capacitor 23 can have a value in the range of 0.1 to 10 microfarads. The circuit thus far described functions to filter alternating current noise signals and to isolate the input from the output. Althogh switches 24 and 25 are illustrated schematically as mechanical switches, it is preferable to employ solid state switches which are actuated by AND circuit 26.

As illustrated in FIG. 1, a plurality of individual input circuits 27*a* . . . 27*n* are provided in addition to the input circuit 27 which is represented by elements 12 through 26. The complete multiplexer of this invention can comprise a plurality of circuits of the type illustrated in FIG. 1. The illustrated FIG. 1 circuit is actuated at a given time by applying an input signal to terminal 31. A selected individual circuit of FIG. 1 is actuated by applying a signal to one of the terminal 30, 30*a* . . . 30*n* to actuate the associated AND circuit and switches. The signals to the inputs of the AND circuits can be controlled by an auxiliary timer or a computer, for example.

Figure 2:
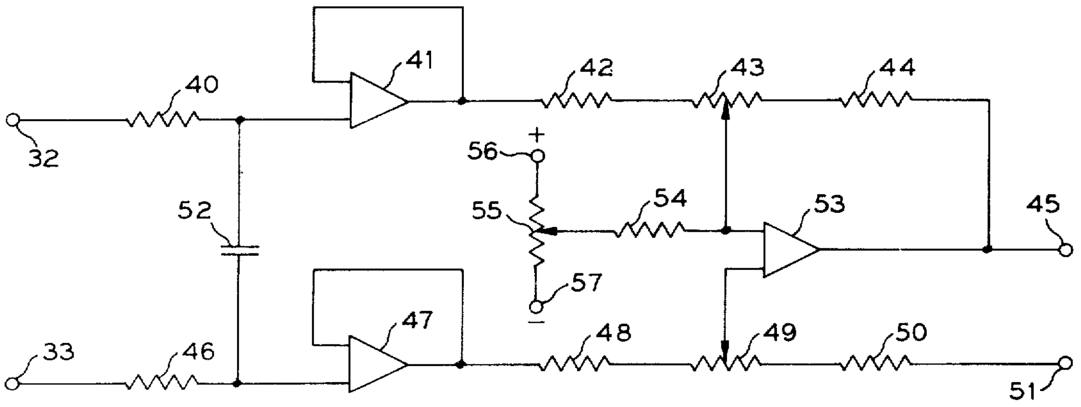
FIG. 2 is a schematic illustration of the common output circuit.

The output circuit of the multiplexer is illustrated in FIG. 2. Terminal 32 is connected by a resistor 40 to the first input of a buffer amplifier 41. The output of amplifier 41 is connected directly to the second input thereof and by a resistor 42, a potentiometer 43 and a resistor 44 to an output terminal 45. Terminal 33 is connected by a resistor 46 to the first input of an amplifier 47. The output of amplifier 47 is connected directly to the second input thereof and by a resistor 48, a potentiometer 49 and a resistor 50 to an output terminal 51. A filter capacitor 52 is connected between the input terminals of amplifiers 41 and 47. The first and second inputs of a differential amplifier 53 are connected to the respective contactors of potentiometers 49 and 43. The output of amplifier 53 is connected to terminal 45. The second input of amplifier 53 is connected by a resistor 54 to the contactor of a potentiometer 55. The end terminals of potentiometer 55 are connected to respective positive and negative potential terminals 56 and 57.

In an example of this invention, resistors 40 and 46 can be 1,000 ohms each. Capacitor 52 can be 510 microfarads. Resistors 44 and 50 can be 10,000 ohms each; resistors 42 and 48 can be in the range of 20,000 to 100,000 ohms each; and potentiometers 43 and 49 can have resistances of 100 ohms each.

Amplifiers 41 and 47 function as unity gain followers. Differential amplifier 53 is employed so that the zero point of the output circuit can be adjusted by potentiometer 55 and any unbalance of the circuit can be compensated by adjustment of the potentiometers connected to the inputs of the differential amplifier. The gain is regulated by potentiometer 43.

Buffer amplifiers 13 and 16 provide isolation of the input filter capacitor 23 from the stray circuit capacity and the input capacity of the output buffer amplifier circuit. This prevents loading or discharge of the input filter capacitor into the stray capacity of the amplifier circuit at the time of switching. The input buffer amplifier pairs serve to provide a constant very high impedance load on the input filter capacitor while providing a very low output impedance. Thus, the voltage at the output of the output circuit is correct at the time a channel is sampled. This results in an accurate multiplexing system which can be operated at high speeds with input filtering.

If a plurality of circuits of the type illustrated in FIG. 1 are employed, all of the output terminals 32 and 33 of these circuits are connected to the input terminals of an individual output circuit of the type illustrated in FIG. 2. The output of the circuit of FIG. 2 can be connected to additional multiplexing circuits or to an analog-to-digital converter if it is desired to convert the analog signals to digital form to be applied to a digital computer, for example.

While this invention has been described in conjunction with a presently preferred embodiment, it should be evident that it is not limited thereto.

What is claimed is:

1. A multiplexer comprising:

an output circuit comprising first and second buffer amplifiers, first and second output terminals, a differential amplifier having first and second inputs and an output, means connecting the output of said differential amplifier to said first output terminal, a first potentiometer connected between the output of said first amplifier and said first output terminal, a second potentiometer connected between the output of said second amplifier and said second output terminal, and means connecting the first and second inputs of said differential amplifier to the contactors of said first and second potentiometers, respectively; and a plurality of input circuits, each comprising first and second input terminals, third and fourth buffer amplifiers, means connecting said first input terminal to the input of said third amplifier and said second input terminal to the input of said fourth amplifier, and circuit means including switching means to connect the outputs of said third and fourth amplifiers selectively to the inputs of said first and second amplifiers, respectively, of said output circuit.

2. The multiplexer of claim 1 wherein each of said input circuits includes an AND circuit having first and second inputs and an output, and means connecting the output of said AND circuit to said switching means to close same in response to the AND circuit being actuated by signals being received at its first and second inputs; and further comprising means connecting the second inputs of the AND circuits of said plurality of input circuits together to receive a common signal.

3. The multiplexer of claim 1 wherein a low pass filter is connected in each of said input circuit means.

4. The multiplexer of claim 1 wherein a low pass filter is connected between said switching means and said first and second buffer amplifiers.

5. The multiplexer of claim 1, further comprising means to apply a bias potential of preselected magnitude to one of the inputs of said differential amplifier.

* * * * *